(12) United States Patent  
Henkel

(10) Patent No.: US 6,351,793 B2  
(45) Date of Patent: Feb. 26, 2002

(54) MEMORY LATENCY COMPENSATION

(75) Inventor: Thomas Henkel, Boeblingen (DE)

(73) Assignee: Agilent Technologies, Inc., LOveland, CO (US)

(*) Notice: Subject to any disclaimer, the term of this patent is extended or adjusted under 35 U.S.C. 154(b) by 0 days.

(21) Appl. No.: 09/137,439

(22) Filed: Aug. 20, 1998

(30) Foreign Application Priority Data

Sep. 13, 1997 (EP) .............................................. 97115982

(51) Int. Cl.$^7$ .............................................. G06F 12/00
(52) U.S. Cl. ........................................ 711/167; 711/10
(58) Field of Search ................................ 711/167, 168, 711/169, 110; 712/215

(56) References Cited

U.S. PATENT DOCUMENTS

| | | | |
|---|---|---|---|
| 4,216,533 A | | 8/1980 | Ichimiya et al. ......... 365/189.04 |
| 5,317,718 A | * | 5/1994 | Jouppi ......................... 711/137 |
| 5,890,207 A | * | 3/1999 | Sne et al. .................... 711/113 |
| 5,890,219 A | * | 3/1999 | Scaringella et al. ......... 711/162 |
| 6,038,649 A | * | 3/2000 | Ozawa et al. ............... 711/217 |
| 6,112,266 A | * | 8/2000 | Yeh .............................. 710/52 |

FOREIGN PATENT DOCUMENTS

EP 0228332 A 12/1986

OTHER PUBLICATIONS

European Search Report, Mar. 2, 1998.

* cited by examiner

*Primary Examiner*—Matthew Kim
*Assistant Examiner*—Matthew D. Anderson

(57) ABSTRACT

An impact of a memory latency time on repeat operations with a memory is reduced by providing a repeat start buffer for buffering a beginning of a data sequence to be repeatedly accessed, and a repeat switching unit, connected with the memory and the repeat start buffer, for switching therebetween for accessing the buffered beginning of the data sequence to be repeatedly accessed when the data sequence is to be repeated. In case of jump operations, a further reduction is achieved by providing a first and a second data buffer connectable with the memory for buffering data sequences, and a switching unit, connected with the data buffers for switching therebetween. The memory is accessible for each data buffer during an idle memory accessing time of the other data buffer for buffering a beginning of a data sequence to be accessed successively.

11 Claims, 7 Drawing Sheets

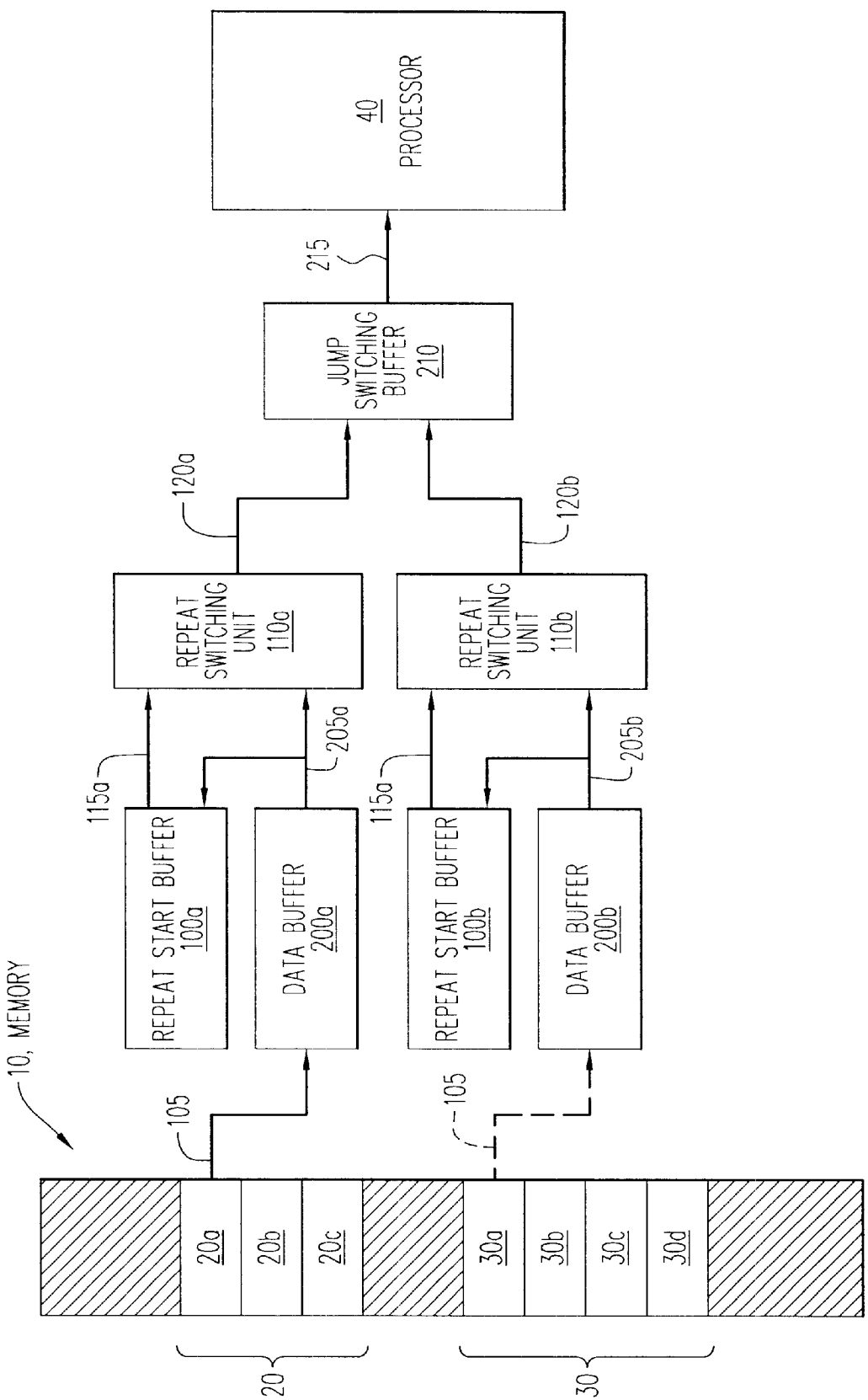

MEMORY LATENCY COMPENSATION

BACKGROUND OF THE INVENTION

The present invention generally relates to a compensation of latency effects on memories.

Computer systems generally comprise more or less complex memory units for storing information, such as data or programs (sequences of instructions), on a temporary or permanent basis. The term 'memory' as used herein shall refer to any storage device such as disks, tapes, semiconductor devices, or the like, and is not limited to a certain type of purposes or applications such as in microcomputers. The term 'data' as used herein shall refer to any kind of information such as individual or collective data, programs, instructions, as well on a temporary or permanent basis.

An access onto a memory is normally composed of three basic operations: 1) Telling the memory what to do, for example, read a number of bytes from a location in the memory; 2) waiting for the memory to complete an access; and 3) receiving the read out data or writing data into the memory. The transfer at the system level can be broken down to three timing parameters: (a) address transport, (b) data access time and (c) data transport. The address transport can be defined as the time required to get a new address and any control into an interface of the memory. This transport time generally is a function of the memory interface only. The data access time can be defined as the time to perform a data access, i.e. the time required for the memory to access a certain data from the internal memory array or core. The data transport can be defined as the time required to move the data from or to the memory and generally depends on the bandwidth, or signaling rate of the memory interface.

An important application of memories, and in particular deep memories (i.e. memories with a large memory capacity), is in testing applications for testing e.g. integrated circuits (IC's) or other electronic devices, such as the Hewlett-Packard HP 83000 Digital IC Test Systems. A typical testing unit comprises a tester circuit and a device under test (DUT), which can be an IC or any other electronic device. Details of such testing devices can e.g. be found in U.S. patent application Ser. No. 09/050,505, issued as U.S. Pat. No. 6,216,243, co-pending U.S. patent application Ser. No. 09/140,427, and in the issued U.S. Pat. Nos. 6,065,144 and 6,055,644, all of the same applicant. The tester circuit generally comprises a signal generating unit for generating and applying a stream of stimulus data to the DUT, a signal receiving unit for receiving a response on the stream of stimulus data from the DUT, and a signal analyzing unit for comparing the response with an expected data stream. Test data applied to the DUT is also called vector data or test vector and comprises one or more single individual vectors. Each individual vector may represent a signal state which is either to be applied at one or more inputs of the DUT or output by the DUT, at a given point in time. In a digital IC-Tester vectors are normally executed in a sequential stream with parts of varying length thereof being repeated a certain number of times.

In particular digital IC-testers have a growing need for fast and deep memory to store the test vectors that are necessary to stimulate the DUT and to evaluate its response. As the DUTs become more and more complex and have an increasing amount of gates to be tested, the vector sequences become accordingly huge. In order to provide those massive amounts of memory at a reasonable price, memory devices with a high memory density are usually used, which also allow for high vector rates to minimize the test execution time and also to be able to test the DUT at its intended operating speed. The memory technology with the highest memory density presently is the dynamic random access memory (DRAM) technology.

A general limitation of all memories is the so-called latency time, as the time interval between the instant at which an instruction control unit initiates a call for data and the instant at which the actual transfer of data begins, or in other words, the time needed to access the first data word at a random address. The latency time generally increases the data access time. The latency time is not a fixed value for a certain memory or type of memory, but depends on the actual data access. However, in most memories the latency time substantially is a constant value for most of the data accesses. For the sake of simplicity, the latency time shall be regarded the following as a constant value for a certain memory.

Although the physical time to internally access a certain type of memory might be the same, the differences between memory devices that may affect the latency time can be the speed at which an address and a (control) information can be moved to the memory device, and the speed at which data can be moved back to a controller.

In applications which require only sequential (or as a synonym: serial) accessing, such as reading or writing, onto memories, i.e. an access onto the memory (e.g. data is to be written into the memory) occurs sequentially (or serially) in successive physical positions from a first starting address, the latency time only appears for accessing the starting address. After the first data word of the serial data has been accessed within the latency time, the reading or writing operation of the sequential data successive to the first data word at the starting address can be executed with a memory speed which generally is much higher than the 'speed' to access the first data word and normally is the maximum speed supported by the memory. This operation is also called a first data accessing operation, i.e. accessing the first data word of a serial data. In general, the latency time occurs with every first data accessing operation. It is to be understood, that during this latency time no data is available and a running process requiring further data needs to wait for that further data.

FIG. 1 shows an example of a memory 10 comprising (amongst other data which is not indicated) a first serially stored data area 20 with data blocks 20a, 20b, and 20c, and a second serially stored data area 30 with data blocks 30a, 30b, 30c, and 30d, each stored in contiguous areas of the memory. The memory 10 is controlled by a processor 40 which accesses the memory 10 via a data connection 50, which does not represent a fixed physical connection, but an access line from and to respective data blocks of the memory 10, which might be embodied by any connecting means as known in the art. In the example of FIG. 1, the processor accesses data block 20a via the data connection 50.

When the entire sequentially stored data area 20 is to be read, the latency time occurs only for accessing the (first) data block 20a, as the first data accessing operation. After accessing the data block 20a, the further data blocks 20b and 20c can be read with the memory speed. Accordingly, when the data area 30 is to be read, the latency time occurs only for accessing the data block 30a, as the first data accessing operation. After accessing the data block 30a, the further data blocks 30b, 30c, and 30d can be read with the memory speed.

In case that after accessing (e.g. for reading or writing) a first serial data, e.g. data area 20 or parts thereof, a second serial data is to be accessed, e.g. data area 30 or parts thereof, the latency time occurs first for accessing the first data word of the first serial data, e.g. data block 20a, and then again for accessing the first data word of the second serial data, e.g. data block 30a. This operation is also called a jump operation, i.e. jumping from one serial data to another serial data. In general, the latency time occurs with every jump operation.

In case that accessing a serial data, e.g. data area 20 or parts thereof, has to be repeated, the latency occurs between each accessing of the serial data. This operation is also called a repeat operation, i.e. repeating accessing a serial data. In general, the latency time occurs with every repeat operation. Repeat operations are in most cases only used for reading data and not for writing data since writing the same data repeatedly in the same data area normally is not very meaningful.

Latency problems become important in applications, such as in tester or backup systems, wherein the latency time is not neglectable with respect to other accessing times, e.g for reading or writing data. Particularly in applications with many jump and/or repeat operations, the total time required for accessing all of the requested data might mainly depends on the latency time of the memory.

When a certain data amount is to be accessed, which is not sequentially stored but distributed on various positions of one or more memories, the latency time might occur several times for accessing the entire data amount and can severely increase a data collection time as the time required for accessing the entire data amount. It is clear that in case of a memory latency, the data collection time depends on the individual data amount to be accessed, and in particular on the numbers of first data accessing, repeat, and jump operations.

One obvious possibility to avoid latency problems simply is to use a memory with a reduced or almost zero latency time, such as a synchronous random access memory (SRAM). However, those memories are generally expensive and reveal a low memory density, so that they might not be applicable for applications requiring a great amount of data to be stored.

Another possibility to avoid latency problems could be by sorting and serially storing the requested data already while loading data into the memory instead of jumping between differently stored serial data blocks or repeating certain serially stored data blocks during an execution of the data. However, it is apparent that this approach leads to a severe overhead in memory resources and management for the system software.

A further possibility to avoid latency problems is to use a memory with a reduced or almost zero latency time only for repeat operations in a way that such data sequences to be repeated are stored completely in that memory before an operation. However, that possibility lacks in a reduced flexibility and high costs for the additional memory which needs to be sufficient to store the required data sequences to be repeated.

EP-A-0228332 discloses an automatic test system with a "true tester-per-pin" architecture. In FIG. 6, EP-A-0228332 depicts an apparatus for accessing a memory by means of a RAM data decoder and a cache memory. Programming a loop requires that the address of both the first and last instruction of the loop as well as the number of times the loop is to be repeated is stored in a memory address generator. For the very first loop of a test sequence, this information is provided to the memory address generator prior to the start of the test. When the memory address generator reaches the first address of the loop, it stores this instruction and all the following instructions in the cache memory until the last instruction in the loop is reached. When the last instruction in the loop is reached, the memory address generator will repeat the instruction stored in the cache memory for the number of times that it has been programmed. During the loop the RAM data decoder decodes the instructions arriving from the cache memory rather than instructions from the memory. Loops which are unrestricted in length can be utilised even though the number of instructions required for the loop will not fit into the cache memory. In this event, the RAM data decoder runs from the cache memory until the number of instructions in the cache memory run out, then it returns to the instructions in the memory to complete the loop. This overcomes the problem of needing instant access to the next instruction which cannot occur because of the rather long cycle times of DRAMs, as well as providing the necessary time to fetch and load the addresses a number of cycles for the next loop.

U.S. Pat. No. 4,216,533 discloses a pattern generation with a plurality of low-speed memories having stored therein a plurality of patterns and first and second high-speed memories of higher operating speed than the low speed memories. One of the first and second high-speed memories is read to obtain output patterns and, at the same time, the plurality of low-speed memories are simultaneously read and the read-out data are successively written in the other high-speed memory alternately with each other. Upon completion of pattern generation from the one high-speed memory, pattern generation from the other high-speed memory is achieved.

SUMMARY OF THE INVENTION

It is an object of the invention to reduce an impact of the memory latency time on access operations onto the memory. The object is solved by the features of the independent claims.

According to a first aspect of the invention, an impact of the memory latency time on repeat operations with a memory (10) is reduced by providing a repeat start buffer (100), connectable with the memory (10), for simultaneously buffering a beginning of a data sequence to be repeatedly accessed, while the data sequence is accessed for the first time of the repeated access and a repeat switching unit (110), connectable with the memory (10) and connected with the repeat start buffer (100), for switching between the memory (10) and the repeat start buffer (100). The repeat switching unit (110) is switchable to the repeat start buffer (100) for accessing the buffered beginning of the data sequence to be repeatedly accessed.

A repeated accessing of the memory (10) for reading and/or writing a data sequence can be accomplished by applying the steps of:
 (a) during a first accessing cycle:
  (a1) accessing the memory (10) and
  (a2) buffering a beginning of the data sequence-in a repeat start buffer (100);
 (b) during each successive accessing cycle:
  (b1) accessing first the buffered beginning of the data sequence from the repeat start buffer (100),
  (b2) setting a data connection to the memory (10) at an address successive to the buffered data sequence, and
  (b3) accessing then further data from the memory (10).

According to a second aspect of the invention, an impact of the memory latency time on jump operations with a memory (10) is reduced by providing a first data buffer (200a) and a second data buffer (200b), each connectable with the memory (10) and for buffering data sequences, a jump switching unit (210), connected with the first data buffer (200a) and the second data buffer (200b), for switching between the first data buffer (200a) and the second data buffer (200b). The memory (10) is accessible for each one of the data buffers (200a,b) during an idle memory accessing time of the other one of the data buffers (200a,b) for buffering a beginning of a data sequence to be accessed successively.

A repeated accessing of different areas in a memory (10) can be accomplished by applying the steps of:

(a) reading or writing a first data sequence from or for a first area (20) by using a data connection (105);

(b) during an idle time of the data connection (105), buffering in a first data buffer (200b) a beginning of a second data sequence from or for a second area (30); and (c) after jumping to the second area (30):
 (c1) reading out the buffered beginning of the second data sequence from the first data buffer (200b),
 (c2) setting the data connection (105) in the second area (30) on an address successive to the data sequence buffered in the first data buffer (200b), and
 (c3) reading or writing further data of the second data sequence from or for the second area (30) by using the data connection (105).

The first and second aspects of the invention can also be combined allowing to reduce an impact of the memory latency time on repeat operations, jump operations, and/or combined repeat and jump operations. The repeat and/or jump operations can be used as well reading and/or for writing data.

By buffering the beginning of a data sequence to be repeated and/or to be accessed successive to a current access operation, the waiting time due to latency effects between successive accessing cycles/operations can be reduced or even be eliminated, dependent on the storage capacity of the respective applied buffer. The buffer storage capacity is therefore preferably in accordance with the expected latency time, and preferably with the maximum latency time of the memory, meaning that the latency time is covered by the data content of the buffer. This allows to provide a continuous or almost continuous data stream with a minimum of components and management overhead required and with a high flexibility. The buffering can be provided during the access operations and need not be prepared in advance.

The invention can be preferably used in a testing system, and in particular in an IC tester.

BRIEF DESCRIPTION OF THE DRAWINGS

Other objects and many of the attendant advantages of the present invention will be readily appreciated and become better understood by reference to the following detailed description when considering in connection with the accompanied drawings, in which:

FIGS. 4a, 4b, and 4c show embodiments providing an improved data access time for jump operations between different areas of serially stored data and/or for repeat operations;

DETAILED DESCRIPTION OF THE INVENTION

1. Repeat Operations

Figure 1:
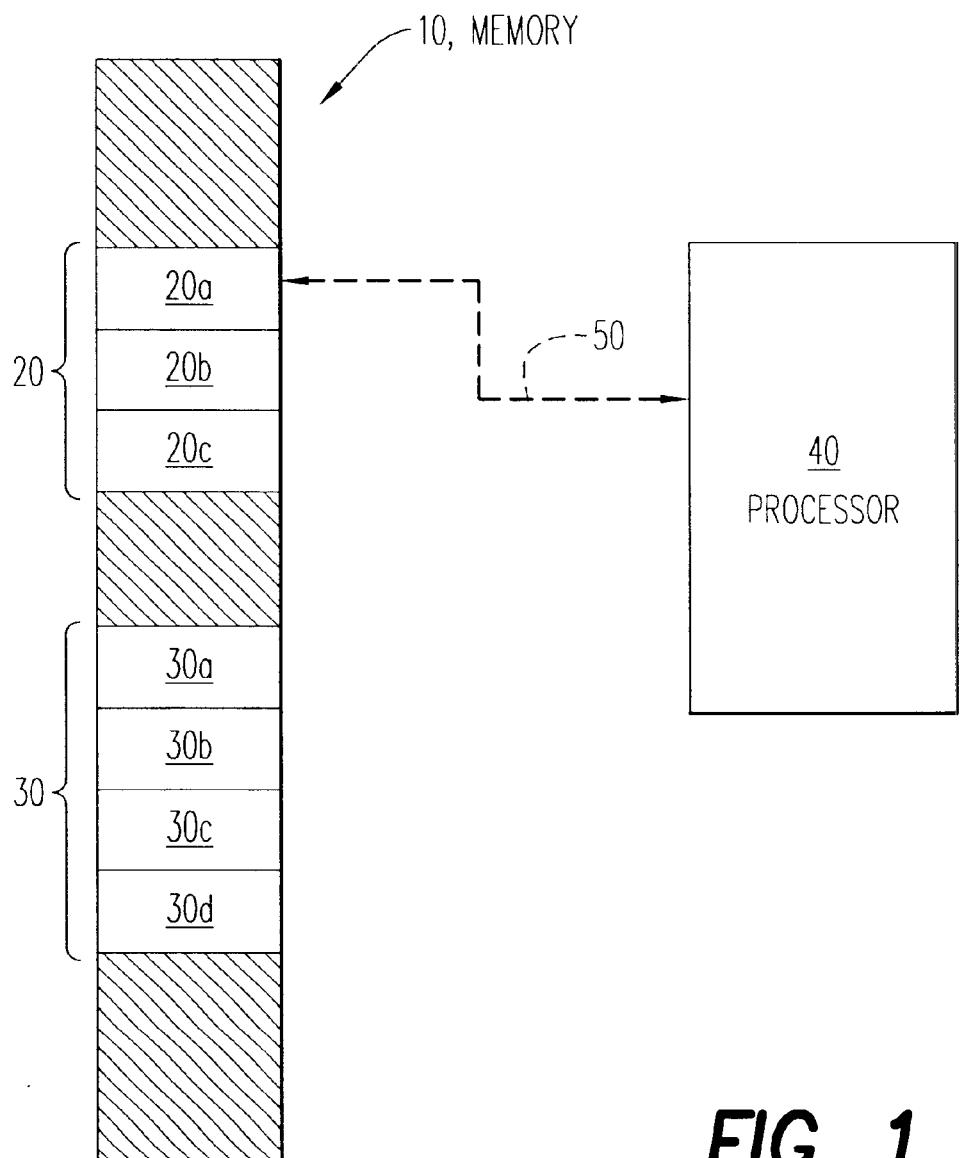
FIG. 1 shows an example of a memory comprising serially stored data areas.
Figure 2:
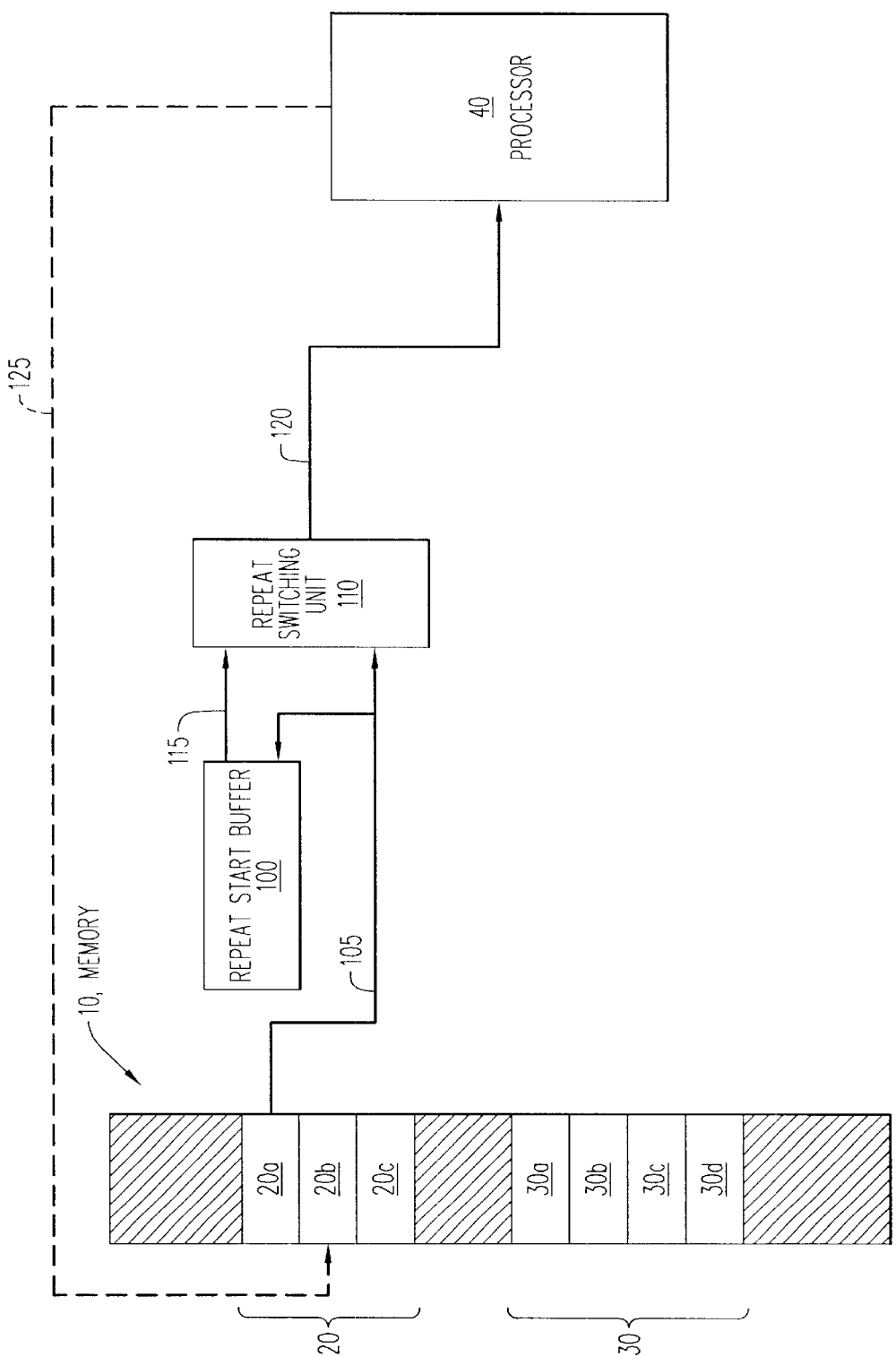
FIG. 2 shows an embodiment according to a first aspect of the invention, providing an improved data access time-for repeat operations.

FIG. 2 shows an embodiment according to a first aspect of the invention, providing an improved data access time for repeat operations. A repeat start buffer 100 is connected with the memory 10 via a data connect ion 105, and with a repeat switching unit 110 via a data line 115. The repeat switching unit 110 is also connected with the memory 10 via the data line 105, and via a data line 120 with the processor 40. The arrows of the lines as used in FIG. 2 indicate the direction of a data flow for an example of a read access on the memory 10.

It is to be understood that any data connection as referred to herein does not represent a fixed physical connection, but an access line from and to respective data blocks of the memory 10, which might be embodied by any connecting means as known in the art. The pointing of any data connection from or to any one of the data blocks of the memory 10 shall mean that the respective data block can be accessed (read or write) via the respective data connection, whereby the direction of the pointing indicates the direction of the data flow for either a read or a write operation. As in the example in FIG. 2, the pointing of the data connection 105 from the data block 20a means that the data block 20a can be read via the data connection 105.

1.1. Read Repeat Operation

At the start of a repeat operation when a certain data, e.g. data area 20, is to be read repeatedly, the processor 40 sets the data connection 105 to access the first data word of the data to be read, e.g. data block 20a. After the latency time, the first data word is available and applied via the data connection 105 as well to the repeat start buffer 100 as to the repeat switching unit 110. At the beginning of the first repeat cycle, the repeat switching unit 110 switches the data connection 105 on the data line 120, so that eventually, the processor 40 can start reading the data from the memory 10. In the example, processor 40 starts reading the data area 20 from the first data block 20a until the last data block 20c of the data area 20 (as one repeat cycle). Simultaneously, the data to be read (the data area 20 in the example) is also applied via the data connection 105 to the repeat start buffer 100, and a certain amount of that data, preferably according to the storage capacity of the repeat start buffer 100, is buffered therein. In the example, the repeat start buffer 100 shall buffer the first data block 20a.

It is to be understood that the amount of data buffered by the repeat start buffer 100 depends on its storage capacity, whereas the start of the buffered data corresponds with the starting address of the repeat cycle for a repeated reading of that data. The repeat start buffer 100 is preferably selected as latency free or at least having a neglectable latency time. For the sake of simplicity in the following contemplations and explanations, the repeat start buffer 100 shall be regarded as having no latency time.

When the end of the data to be read (during the first repeat cycle) is reached and this reading cycle is to be repeated again, the repeat switching unit 110 now switches (at the start of the second repeat cycle) the repeat start buffer 100 via the data line 115 on the data line 120, so that the processor 40 can immediately start reading the data buffered in the repeat start buffer 100. In the example, processor 40 starts reading the first data block 20a from the repeat start buffer 100. Simultaneously, the processor 40 initiates (as indicated by an arrow 125) the memory 10 to access the data to be read, however in this case not from the start of the entire data, but (at least) from the first data word of the data to be read which is not buffered by the repeat start buffer 100. In the example, the first data word of the data to be read which is not buffered by the repeat start buffer 100 is the data block 20b (as indicated by the arrow 125). After the latency time, this data word (e.g. data block 20b) will be available and also applied via the data connection 105 (however now accessing the data block 20b as indicated by arrow 125) to the repeat start buffer 100 and to the repeat switching unit 110. The repeat switching unit 110 now switches the data connection 105 on the data line 120, so that again, the processor 40 can start reading the data directly from the memory 10, however now starting from that data word accessed as indicated by the arrow 125. In the example, the processor 40 first reads the data block 20a buffered into the repeat start buffer 100, simultaneously the data connection 105 is set on the data block 20b, and the processor 40 then reads the data blocks 20b and 20c directly from the memory 10. It is clear that in the second repeat cycle, the repeat start buffer 100 does not need to buffer any further data applied by the data connection 105.

Each successive repeat cycle will be repeated substantially in the same way as the second repeat cycle explained above. However, during the last repeat cycle, the repeat start buffer 100 might already by used for other purposes, e.g. as will be explained later.

The repeat switching unit 110 is controlled and synchronized in a way that the repeat switching unit 110 switches from the data connection 105 to the data line 115 when a certain data to be accessed is (at that moment) not available from the memory 10 but is buffered in the repeat start buffer 100. In case that this certain data is available as well from the memory 10 as from the repeat start buffer 100, the repeat switching unit 110 may select either one of the data connection 105 or the data line 115, but will preferably select the data connection 105, and thus the memory 10, and the successive data will then be read from the memory 10 directly. When the certain data to be accessed is not buffered in the repeat start buffer 100, the repeat switching unit 110 switches from the data line 115 to the data connection 105, and the processor continues reading from the memory 10 directly. In a preferred embodiment, the data connection 105 is set to the data address following the data address of the data which last buffered in the repeat start buffer 100, so that the data will only be available either from the repeat start buffer 100 or directly from the memory 10.

The buffering of the repeat start buffer 100, the switching of the repeat switching unit 110, and the setting of the data connections 105 is controlled by the processor 40, as known in the art. For that purpose, the processor 40 preferably receives an instruction comprising the length and the location of the sequence to be repeated and derives therefrom the information how to control the individual elements.

The storage capacity of the repeat start buffer 100 is preferably selected as being in accordance with the latency time of the memory 10, meaning that the repeat start buffer 100 can buffer as much data as can be read from the memory 10 (without latency) during a time period that corresponds to the latency time of the memory 10. In a preferred embodiment, the storage capacity of the repeat start buffer 100 is selected corresponding to the maximum latency time appearing in the memory 10. In that case, the repeat start buffer 100 can cover any possible situation in that memory 10.

In other words, a repeat operation according to the first aspect of the invention is executed by the steps of:
(a) during the first repeat cycle:
reading the data to be read directly from the memory 10 and buffering the beginning of that data in the repeat start buffer 100;
(b) during each successive repeat cycle:
reading first the buffered beginning of the data to be read from the repeat start buffer 100 and reading then the rest of that data to be read directly from the memory 10.

1.2. Write Repeat Operation

The arrows in FIG. 2 indicate the direction of the data flow for the example of a read access on the memory 10. Although a write access in a repeat operation appears in general to be not very meaningful, it is clear that the embodiment of FIG. 2 can also be used for write accesses, whereby the data flow would be in opposite to the direction as indicated by the arrows in FIG. 2.

2. Jump Operations

Figure 3:
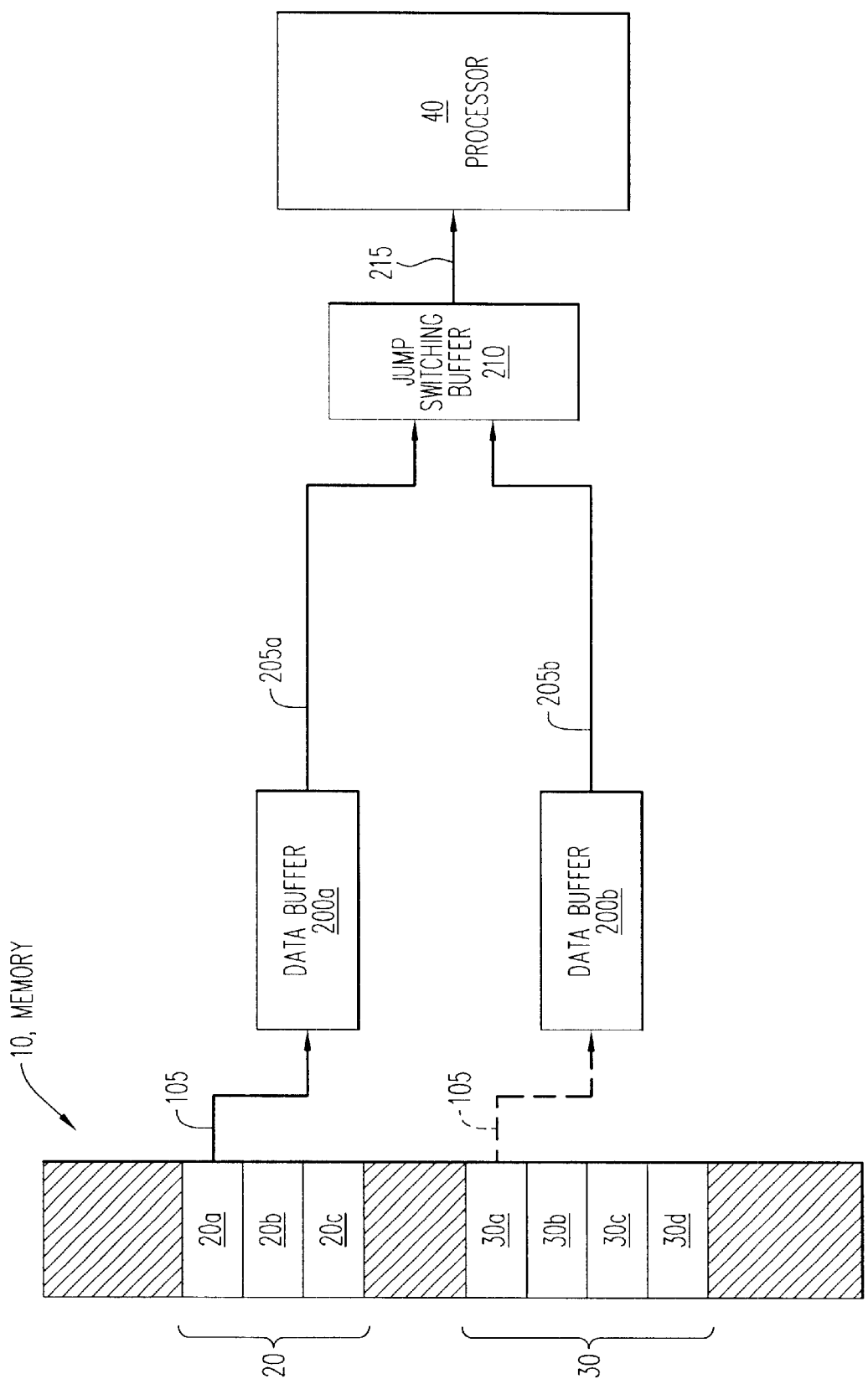
FIG. 3 shows an embodiment according to a second aspect of the invention, providing an improved data access time for jump operations between different areas of serially stored data.

FIG. 3 shows an embodiment according to a second aspect of the invention, providing an improved data access time for jump operations between different areas of serially stored data. The data connection 105 provides access to the memory 10 for a first data buffer 200a and a second data buffer 200b. In order to make clear that the data connection 105 provides access either to the first data buffer 200a or to the second data buffer 200b, the data connection 105 to the second data buffer 200b is depicted by a dotted line. A jump switching unit 210 is connected with the first data buffer 200a via a data line 205a, with the second data buffer 200b via a data line 205b, and with the processor 40 via a data line 215. The arrows in FIG. 3 again indicate the direction of a data flow for the example of a read access on the memory 10.

It is to be understood that for reasons that will be explained later, a data speed on the data lines 205a and 205b is to be selected as being slower than a data speed by the data connection 105. That means that a data transport between the memory 10 and the data buffers 200a and 200b will be faster than a data transport between the data buffers 200a and 200b and the processor 40. In other words, in case of a read access on the memory 10, the data buffers 200a and 200b will be 'filled' quicker from the memory 10 than read out from the processor 40. In case of a write access on the memory 10, the data buffers 200a and 200b will be 'filled' slower from the processor 40 than written into the memory 10.

2.1. Read Jump Operation

At first, a reading access on the memory 10 comprising a jump operation between two different areas of serially stored data, e.g. data areas 20 and 30, is described. At the beginning of the reading access, the processor 40 sets the data connection 105 to access the first area of serially stored data, e.g. data area 20 at data block 20a. The data read out from the first area of serially stored data is buffered by the first data buffer 200a. The jump switching unit 210 is set to switch the data line 205a to the data line 215. The processor 40 starts reading out the first data buffer 200a through the data lines 205a and 215, however as pointed out above, with a slower data speed than the data speed for reading out the memory 10. That means that the first data buffer 200a is 'filled' faster than read out.

As soon as the first data buffer 200a is completely 'filled', the data connection 105 is idle, since no more data can be buffered by the first data buffer 200a. The processor 40 now sets the data connection 105 to access the second area of serially stored data, e.g. the data area 30 at the data block 30a, and the second data buffer 200b starts buffering the data from the second area of serially stored data. When the processor 40 'realizes' that the first data buffer 200a becomes 'empty', meaning that the time for reading out the rest of the data buffered in the first data buffer 200a is in the range or equals the latency time of the memory 10, the processor 40 sets the data connection 105 to again access the first area of serially stored data, however now at the data address successive to the last read out data from the first area of serially stored data, and further data, e.g. from the data area 20, can be buffered in the first data buffer 200a.

In the above example, the first data buffer 200a shall be completely 'filled' with the data block 20a and the data connection 105 becomes idle, since no more data can be buffered by the first data buffer 200a. The processor 40 now sets the data connection 105 to access the data area 30 at the data block 30a, and the second data buffer 200b starts buffering the data block 30a, so that eventually the data block 30a is buffered in the second data buffer 200b. When the processor 40 'realizes' that the first data buffer 200a becomes 'empty', the processor 40 sets the data connection 105 to again access the first area of serially stored data, however now at the data block 20b.

As soon as the processor 40 requires a jump operation to the second area of serially stored data, the start of the second area of serially stored data is already buffered in the second data buffer 200b and can be immediately read out thereof without an additional latency time required. The processor 40 sets the data connection 105 in the second area of serially stored data on the first address after the data buffered in the second data buffer 200b.

It is clear that the amount of data buffered in the second data buffer 200b depends on the size of the second data buffer 200b, an 'idle-time', i.e. the time between successive buffering cycles of the first data buffer 200a, and on the latency time of the memory 10. In case that the idle-time is not sufficient that the second data buffer 200b can start buffering, the processor 40 will preferably maintain the data connection 105 on the first area of serially stored data. In case that there will be no idle-time at all before a jump is requested, it is clear that the second data buffer 200b cannot be filled before jumping. In case that the idle-time is greater than the time to 'fill' the second data buffer 200b, the processor 40 will preferably set the data connection 105 back on the first area of serially stored data straight after 'filling' the second data buffer 200b.

Further jumping between the areas of serially stored data will be accomplished accordingly, whereby dependent on the 'filling state' of the respective data buffers 200, the idle time of the data connection 105 to one of the data buffers 200 can be used for further buffering the other one of the data buffers 200 before jumping.

In other words, a jump operation according to the second aspect of the invention is executed by the steps of:
(a) before jumping from a first area of serially stored data to a second area of serially stored data:
buffering the data to be read from first area of serially stored data in the first data buffer 200a and reading out therefrom, and
during the idle time of the data connection 105, buffering a beginning of the data to be read from second area of serially stored data in the second data buffer 200b;

(b) after jumping from the first area of serially stored data to the second area of serially stored data:
reading out the buffered beginning of the data to be read from the second area of serially stored data from the second data buffer 200b,
setting the data connection 105 in the second area of serially stored data on the first address after the data buffered in the second data buffer 200b and buffering the further data to be read from second area of serially stored data in the second data buffer 200b and reading out therefrom, and
if required—during the idle time of the data connection 105, buffering in the first data buffer 200a a beginning of a data to be read successive after a successive jump operation.

In case that a jumping between more than two areas of serially stored data is to be accomplished, a plurality of data buffers 200$i$, with i=1 . . . n, can be provided allowing to reduce the access times for jump operations between the maximum of n different areas of serially stored data.

2.2. Write Jump Operation

The arrows in FIG. 3 indicate the direction of the data flow for the example of a read access on the memory 10. A write access in a jump operation can be accomplished in accordance with the read access as described above. However, in case of a write accesses, the data flow would be in the opposite direction as indicated by the arrows in FIG. 3. The data flow towards the memory 10 might further be directed and guided by appropriate means as known in the art, such as multiplexors.

3. Mixed Jump and Repeat Operations

Figure 4A:
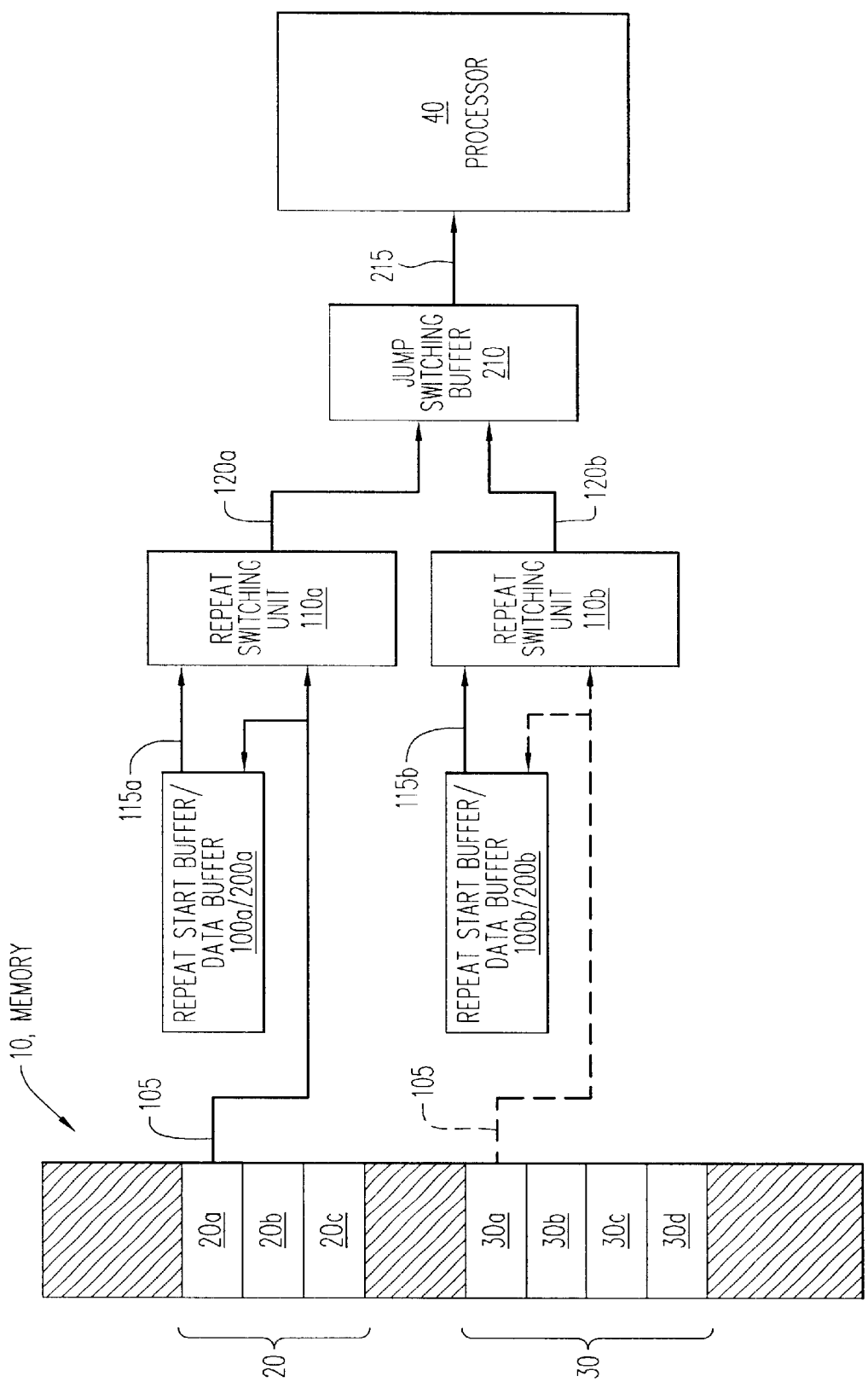
Figure 4B:
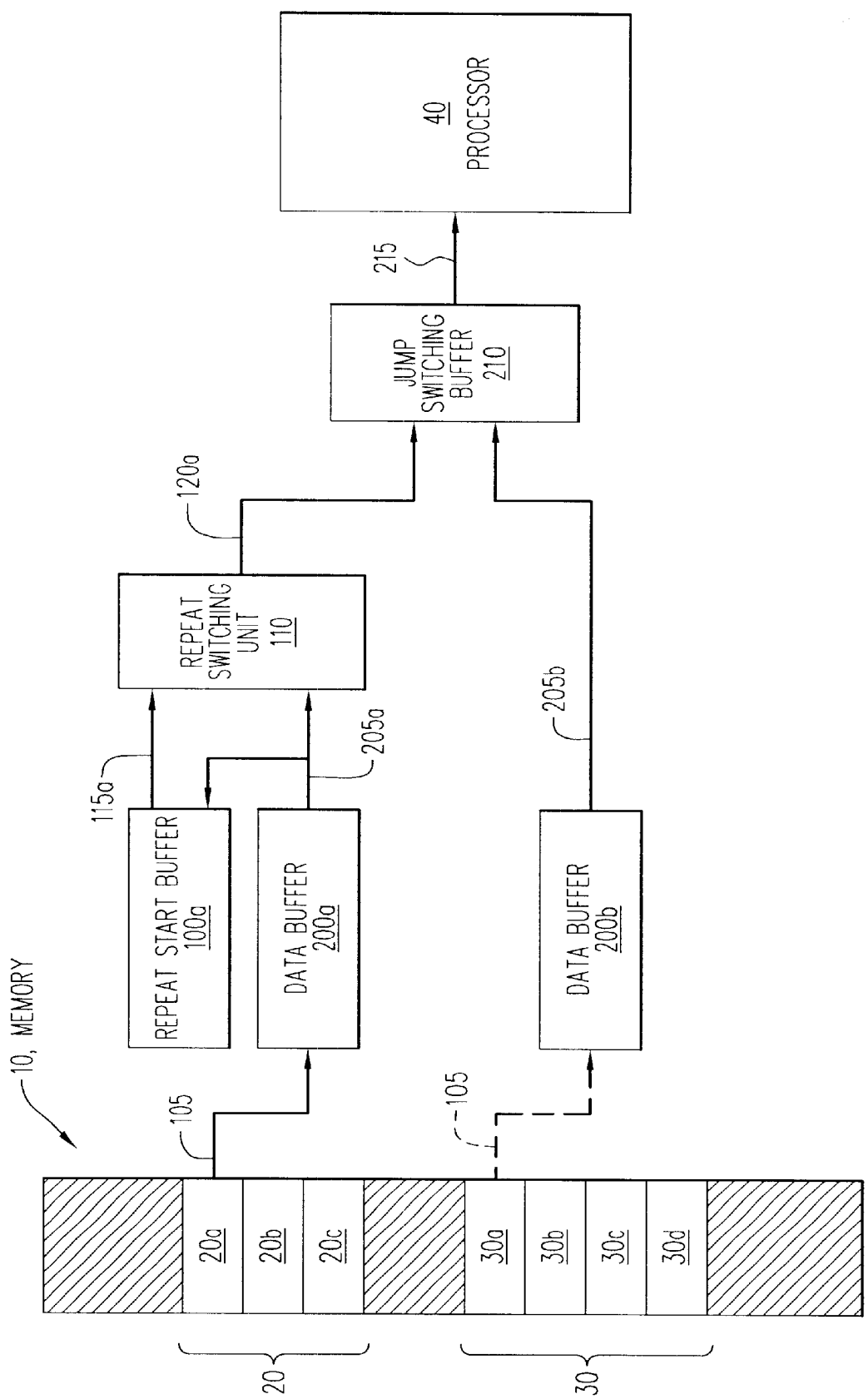
Figure 5:
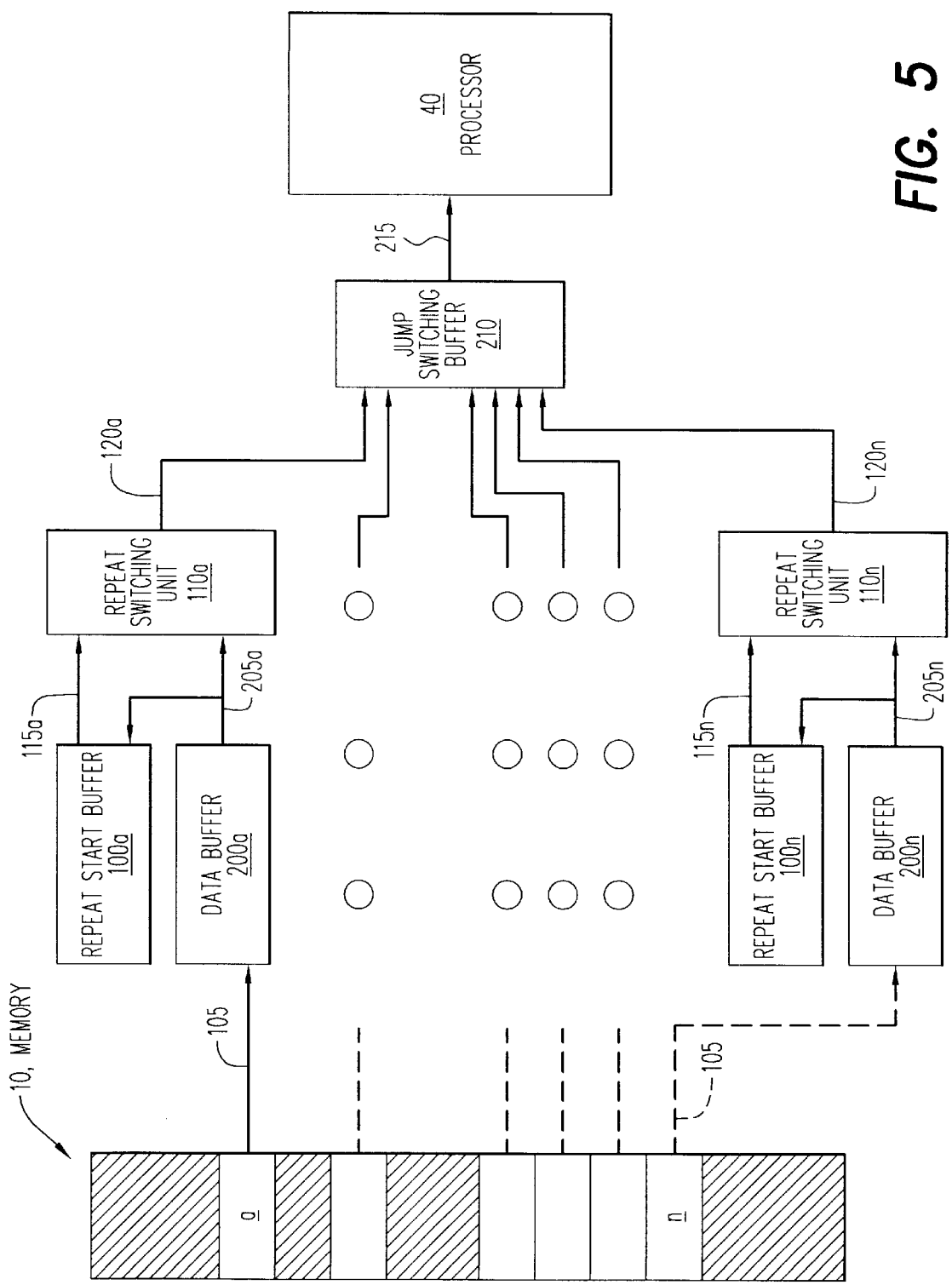
FIG. 5 shows an embodiment providing the improved data access time as well for jump operations between different areas of serially stored data as for repeat operations for a plurality of channels a . . . n.

FIGS. 4a, 4b, and 4c show embodiments providing an improved data access time for jump operations between different areas of serially stored data and/or for repeat operations. The embodiments of FIGS. 4a, 4b, and 4c comprise the elements of the embodiments of FIGS. 2 and 3, however some elements are duplicated in order to implement the jumping and repeating functionality for both 'channels'. FIG. 5 shows an embodiment providing the improved data access time as well for jump operations between different areas of serially stored data as for repeat operations for a plurality of channels a . . . n. Each channel i, with i=a . . . n, comprises a data buffer 200$i$ connectable via the data connection 105 to a respective data area i of the memory 10 and connected via a data line 205$i$ with a repeat start buffer 100$i$ and a repeat switching unit 110$i$. The repeat switching unit 110$i$ is connected via a data line 115$i$ with the repeat start buffer 100$i$ and via a data line 120$i$ with the jump switching unit 210. All other features and connections are in accordance with the FIGS. 2 and 3.

The functioning of the embodiments of FIGS. 4a, 4b, and 5 is in accordance with the above said and allows improved data access times for jump operations, repeat operations, and/or combined jump and repeat operations. In the embodiment of FIG. 4a, the buffering function of the data buffers 200a,b according to FIG. 3 is provided by the repeat start buffers 100a,b in order to support jump and/or repeat operations (the respective elements are therefore referred to as data buffers 100a/200a and 100b/200b, since they are functionally equal). The embodiment of FIG. 4b allows in 'channel' a (with reference numbers a) to support jump and/or repeat operations, whereas 'channel' b (with reference numbers b) allows to support jump operations only. In the embodiment of FIG. 4c—and accordingly in FIG. 5—all channels (a, b, . . . , n) are built up symmetrically and allow a supporting of jump and/or repeat operations. It is to be understood that the structure of a specific embodiment depends on the specific requirements and might comprise channels for supporting jump and/or repeat operations and/or channels for supporting jump operations or repeat operations only.

An example for a read access on the memory 10 comprising jump and repeat operations in the embodiment of FIG. 4c is given in the following, whereby the example could be given accordingly for a write access. To be read is a data sequence consisting of the data blocks: a) 3x 20a–20b–20c; b) 2x 20a–20b–30a–30b; c) 3x 20b–30b–20c. The contribution of the invention with respect to the reduction of access time is indicated for each accessing step by showing e.g. (-1LT), meaning that in this accessing step, the occurrence of the latency time (LT) has been avoided. For this example, the time required to access one of the data blocks equals the latency time, and the storage capacity of the buffers 100 and 200 equals one data block.

a) 3x 20a–20b–20c. At first, the processor 40 sets the data connection 105 to the data block 20a which is buffered in the first data buffer 200a and eventually applied via the data line 205a to the repeat start buffer 100a and also buffered therein. The repeat switching unit 110a switches the data line 205a to the data line 120a, and the jump switching buffer 210 switches the data line 120a via the data line 215 to the processor 40. The successive data blocks 20b and 20c are read accordingly, however only the first data block 20a of that repeat operation is buffered in the repeat start buffer 100a. When the data block 20c is read in the first repeat cycle, the repeat switching unit 110a switches the data line 115a and thus the repeat start buffer 100a to the data line 120a (-1LT). The processor 40 sets the data connection 105 to the data block 20b. When the data block 20b is accessed (after the latency time) started to be buffered in the first data buffer 200a, the repeat switching unit 110a switches again the data line 205a to the data line 120a, and the data blocks 20b and 20c of the second repeat cycle are read from the first data buffer 200a. The third repeat cycle is executed in accordance with the second repeat cycle (-1LT).

b) 2x 20a–20b–20c–30a–30b. Since the beginning (20a) of the partial jump sequence 20a–20b–20c is already buffered in the repeat start buffer 100a, the repeat switching unit 110a switches the data line 115a and thus the repeat start buffer 100a to the data line 120a (-1LT). The processor 40 sets the data connection 105 to the data block 20b. When the data block 20b is accessed (after the latency time) started to be buffered in the first data buffer 200a, the repeat switching unit 110a switches again the data line 205a to the data line 120a, and the data blocks 20b and 20c are read from the first data buffer 200a. It shall be assumed that during buffering of the data blocks 20b and 20c in the first data buffer 200a, an idle time of the data connection 105 is used to already buffer the data block 30a in the second data buffer 200b. Since the partial jump sequence 30a–30b will be repeated again, the data block 30a as the beginning thereof will also be buffered in the repeat start buffer 100b. After the data block 20c is read, the repeat switching unit 110b switches the data line 205b to the data line 120b, and the jump switching buffer 210 switches the data line 120b via the data line 215 to the processor 40, so that the data block 30a can be read from the second data buffer 200b (-1LT). Simultaneously, the data connection 105 is set to access the data block 30b, which is read out in the second data buffer 200b after the latency time. However, since the time for reading out the data block 30a from the second data buffer 200b is greater than the latency time, the data block 30b will be available in the second data buffer 200b straight after reading out the data block 30a, so that no time delay between the data blocks 30a and 30b occurs (-1LT). After reading the data block 30a, this jump sequence is to be repeated. The data block 20a is read out form the repeat start buffer 100a (-1LT) and the data blocks 20b and 20c directly from the memory 10 (via the first data buffer 200a). The data block 30a is read out from the repeat start buffer 100b (-1LT) and the data blocks 30b directly from the memory 10 (via the first data buffer 200b).

c) 3x 20b–30b–20c. During the reading out of the data block 30a–30b of the preceding sequence, an idle time of the data connection 105 is used to already buffer the data block 20b in the first data buffer 200a. Since the data block 20b also represents the beginning of that sequence, the data block 20b will (also) be stored in the repeat start buffer 100a. The data block 20b can thus be read out (-1LT) either from the first data buffer 200a or from the repeat start buffer 100a, dependent whether it is buffered either exclusively in the first data buffer 200a or the repeat start buffer 100a, or in both. Simultaneously, the data connection 105 is set to the data block 30b, which is then buffered in the second data buffer 200b, so that after reading the data block 20b, the data block 30b can be read out from the second data buffer 200b (-1LT). During the reading out of the data block 30b, an idle time of the data connection 105 is used to already buffer the data block 20c in the first data buffer 200a, so that the data block 20c can be read out from the first data buffer 200a (-1LT). The reading out of the next two repeat cycles of the sequence c) is accomplished by reading out the data block 20b from the repeat start buffer 100a, the data block 30b from the second data buffer 200b, and the data block 20c from the first data buffer 200a (totaling: 2x -3LT).

In the described example, the data access time has been decreased by 16 'latency times' for accessing 26 data blocks in total. It is clear that the access time reduction depends on the actual structure of the data to be accessed. It is clear that the given examples can be applied accordingly for write access or combined read and write access.

It is to be understood that the buffering of data as shown above can also comprise an intermediate buffering of such data that is read out during one sequence and will be required during another sequence. However, it is clear that such an intermediate buffering is only possible in case that the respective buffer will not be used before reading out the intermediately buffered data. For example in the sequence c) as above, the first data block 20b to be read could already been immediately buffered in the repeat start buffer 100a during the reading out of the data block 20b in the preceding sequence b).

The repeat start buffers 100 and the data buffers 200 can be implemented by any buffering means as known in the art having an (almost) zero or at least reduced latency time, such as an SRAM, latch or register files. The repeat start buffers 100 are preferably embodied as a RAM, whereas the data buffers 200 are preferably embodied as FIFO (first in, first out) memories.

The repeat switching units 110 and the jump switching unit 210 can be implemented by any switching unit as known in the art, such as a multiplexor.

The processor 40 can be implemented by any processor as known in the art.

The memory 10 can be implemented by any memory or storage as known in the art, such as an SDRAM, RDRAM, DRAM, or a disk.

The data lines 115, 205, 120, 215 can be implemented by any connection means as known in the art, such as busses, single lines, communication channels with or without access protocols, or the like.

What is claimed is:

1. An apparatus for accessing a memory means comprising:

a repeat start buffer, connected with the memory means for simultaneously buffering a beginning of a data sequence to be repeatedly accessed while the data sequence is accessed for a first time of the repeated access;

a repeat switching unit, connected with the memory means and connected with the repeat start buffer, for switching between the memory means and the repeat start buffer, whereby the repeat switching unit is switched to the repeat start buffer for subsequently accessing the buffered beginning of the data sequence to be repeatedly accessed.

2. The apparatus according to claim 1, wherein the storage capacity of the repeat start buffer is selected in accordance with the latency time of the memory means.

3. An apparatus for accessing a memory means comprising:

a first data buffer for buffering data from a first serially stored data area and a second data buffer for buffering data from a second serially stored data area, each connected with the memory means, wherein said second serially stored data area is accessed as a result of a jump operation, a jump switching unit, connected with the first data buffer and the second data buffer, for switching between the first data buffer and the second data buffer, whereby the memory means is accessed by each one of the data buffers during an idle memory accessing time of the other one of the data buffers for buffering a data sequence to be accessed successively.

4. The apparatus according to claim 3, further comprising:

a first repeat switching unit, connected with the first data buffer and with the memory means, for switching between the first data buffer and the memory means, a second repeat switching unit, connected with the second data buffer and with the memory means, for switching between the second data buffer and the memory means, whereby the first data buffer and the second data buffer each buffer a beginning of a data sequence to be repeatedly accessed;

the jump switching unit being connected with the first repeat switching unit and the second repeat switching unit, for switching therebetween.

5. The apparatus according to claim 3, further comprising:

a first repeat start buffer, connected with the first data buffer for buffering a beginning of a data sequence to be repeatedly accessed; and a first repeat switching unit, connected with the first data buffer and the first repeat start buffer, for switching between the first data buffer and the first repeat start buffer, whereby the first repeat switching unit is switched to the first repeat start buffer for accessing the buffered beginning of the data sequence to be repeatedly accessed.

6. The apparatus according to claim 4, further comprising:

a second repeat start buffer, connected with the second data buffer, for buffering another beginning of a data sequence to be repeatedly accessed;

a second repeat switching unit, connected with the second data buffer and the second repeat start buffer, for switching between the second data buffer and the second repeat start buffer, whereby the second repeat switching unit is switched to the second repeat start buffer for accessing the other buffered beginning of the data sequence to be repeatedly accessed.

7. The apparatus according to claim 3, wherein a data transport between the memory means and the first and second data buffers is faster than a data transport between the first and second data buffers and the jump switching unit.

8. A method for repeatedly accessing a memory means for reading and/or writing a data sequence, the method comprising the steps of:

(a) during a first accessing cycle:
(a1) accessing the memory means and
(a2) simultaneously buffering a beginning of the data sequence in a repeat start buffer;

(b) during each successive accessing cycle:
(b1) accessing first the buffered beginning of the data sequence from the repeat start buffer,
(b2) setting a data connection to the memory means at an address successive to the buffered data sequence, and
(b3) accessing then further data from the memory means.

9. A method for accessing different areas in a memory means comprising the steps of:

(a) reading or writing a first data sequence from or for a first area by using a data connection;

(b) during an idle time of the data connection, buffering in a first data buffer a beginning of a second data sequence from or for a second area;

(c) jumping to the second area; and
(c1) reading out the buffered beginning of the second data sequence from the first data buffer,
(c2) setting the data connection in the second area on an address successive to the data sequence buffered in the first data buffer, and
(c3) reading or writing further data of the second data sequence from or for the second area by using the data connection.

10. The method according to claim 9, wherein step (a) comprises the steps of:

(a1) buffering the first data sequence in a second data buffer, and (a2) reading or writing the first data sequence from the second data buffer.

11. The method according to claim 9, further comprising successive to step (c3) a step of:

(c4) buffering in the second data buffer a beginning of a successive data sequence from or for another area, during an idle time of the data connection.

* * * * *